United States Patent
Lin et al.

(10) Patent No.: US 9,741,654 B2
(45) Date of Patent: Aug. 22, 2017

(54) INTEGRATED CIRCUIT HAVING SLOT VIA AND METHOD OF FORMING THE SAME

(71) Applicant: Taiwan Semiconductor Manufacturing Company, Ltd., Hsin-Chu (TW)

(72) Inventors: Wei-Cheng Lin, Taichung (TW); Jiann-Tyng Tzeng, Hsinchu (TW); Praneeth Narayanasetti, Hsinchu (TW); Charles Chew-Yuen Young, Cupertino, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/332,605

(22) Filed: Oct. 24, 2016

(65) Prior Publication Data

US 2017/0040260 A1  Feb. 9, 2017

Related U.S. Application Data

(63) Continuation of application No. 14/600,695, filed on Jan. 20, 2015, now Pat. No. 9,478,492.

(51) Int. Cl.
| | |
|---|---|
| *H01L 23/52* | (2006.01) |
| *H01L 29/40* | (2006.01) |
| *H01L 21/4763* | (2006.01) |
| *H01L 21/44* | (2006.01) |
| *H01L 23/522* | (2006.01) |

(Continued)

(52) U.S. Cl.
CPC .... *H01L 23/5226* (2013.01); *H01L 21/76802* (2013.01); *H01L 21/76879* (2013.01); *H01L 21/76895* (2013.01); *H01L 23/485* (2013.01); *H01L 23/528* (2013.01);
(Continued)

(58) Field of Classification Search
CPC ................. H01L 21/486; H01L 21/768; H01L 21/823475; H01L 23/481; H01L 23/5226; H01L 23/535; H01L 23/538; H01L 27/14636; H01L 2224/82; H01L 2224/4824
USPC ............... 438/622, 625, 637, 638, 640, 652; 257/750, 758–760, 774–776
See application file for complete search history.

(56) References Cited

U.S. PATENT DOCUMENTS

| | | |
|---|---|---|
| 5,616,934 A | 4/1997 | Dennison et al. |
| 6,316,836 B1 | 11/2001 | Mayuzumi |

(Continued)

FOREIGN PATENT DOCUMENTS

DE   102012108665   11/2013

OTHER PUBLICATIONS

Korean Intellectual Property Office, Korean Office Action dated Apr. 1, 2016 for Patent Application No. 10-2015-0089013; 12 pgs.

*Primary Examiner* — Hsien Ming Lee
(74) *Attorney, Agent, or Firm* — Haynes and Boone, LLP

(57) ABSTRACT

An integrated circuit includes a first conductive line on a first metal level of the integrated circuit. The integrated circuit further includes a second conductive line on a second metal level of the integrated circuit. The integrated circuit further includes a slot via electrically connecting the first conductive line with the second conductive line. The slot via overlaps with the first conductive line and the second conductive line. The slot via extends beyond a periphery of at least one of the first conductive line or the second conductive line.

20 Claims, 6 Drawing Sheets

(51) Int. Cl.
*H01L 21/768* (2006.01)
*H01L 23/485* (2006.01)
*H01L 23/528* (2006.01)
*H01L 23/532* (2006.01)

(52) U.S. Cl.
CPC ...... *H01L 23/5222* (2013.01); *H01L 23/5328* (2013.01); *H01L 23/53209* (2013.01); *H01L 2924/0002* (2013.01)

(56) References Cited

U.S. PATENT DOCUMENTS

| | | |
|---|---|---|
| 8,750,011 B2 | 6/2014 | Liaw et al. |
| 2004/0252548 A1* | 12/2004 | Tsukamoto ......... H01L 27/1104 365/154 |
| 2013/0292836 A1 | 11/2013 | Tang et al. |
| 2013/0292841 A1 | 11/2013 | Lai et al. |
| 2014/0159158 A1 | 6/2014 | Kim et al. |

\* cited by examiner

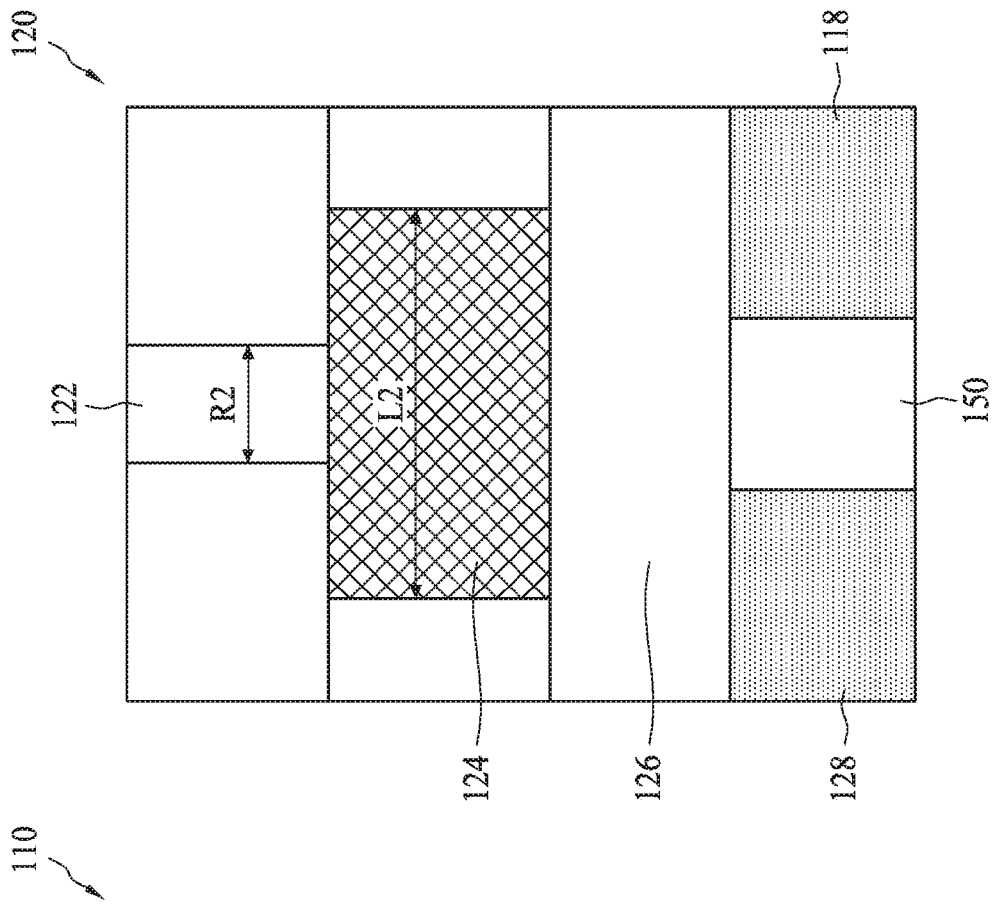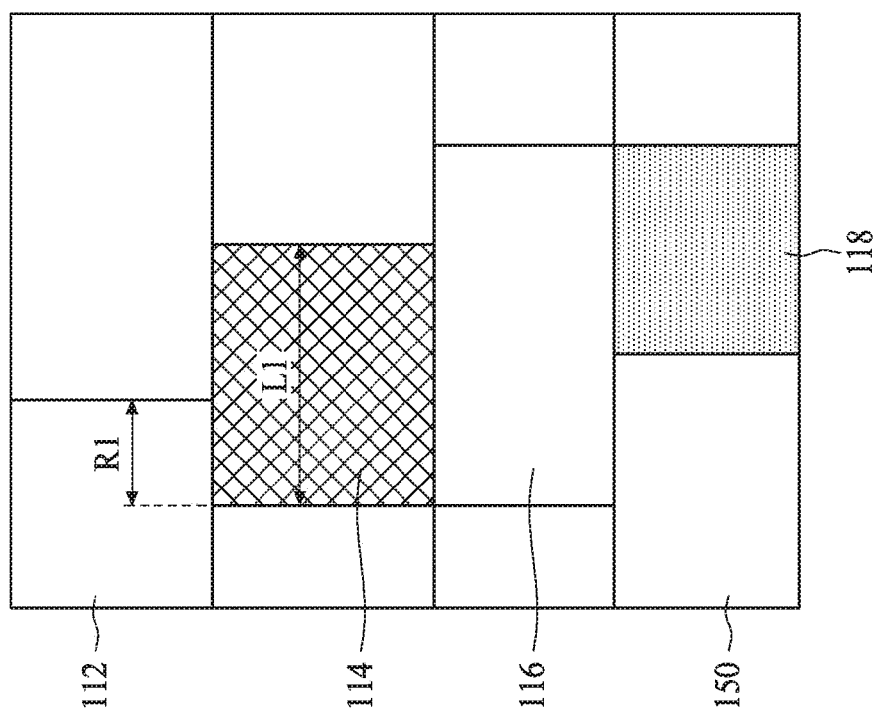

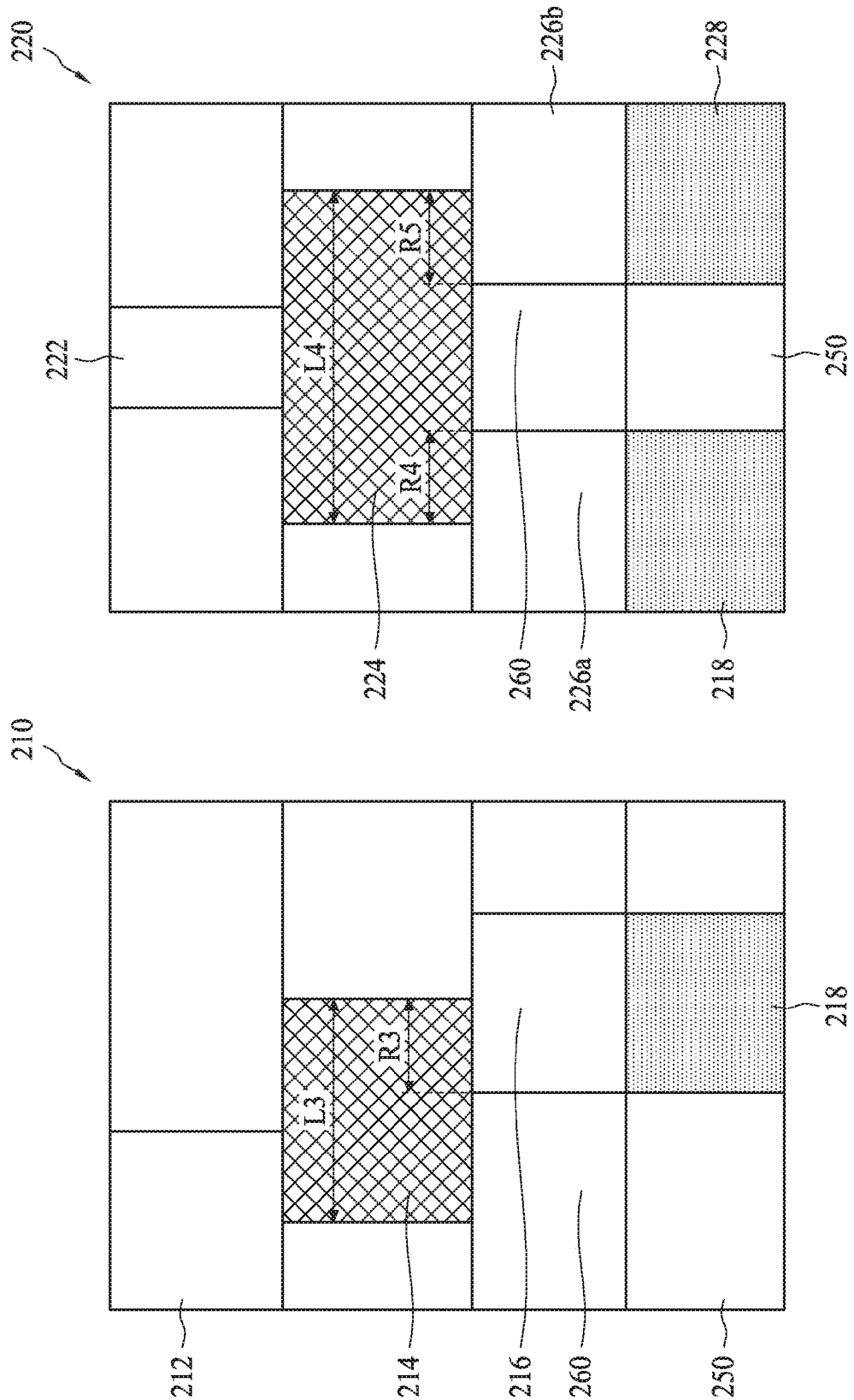

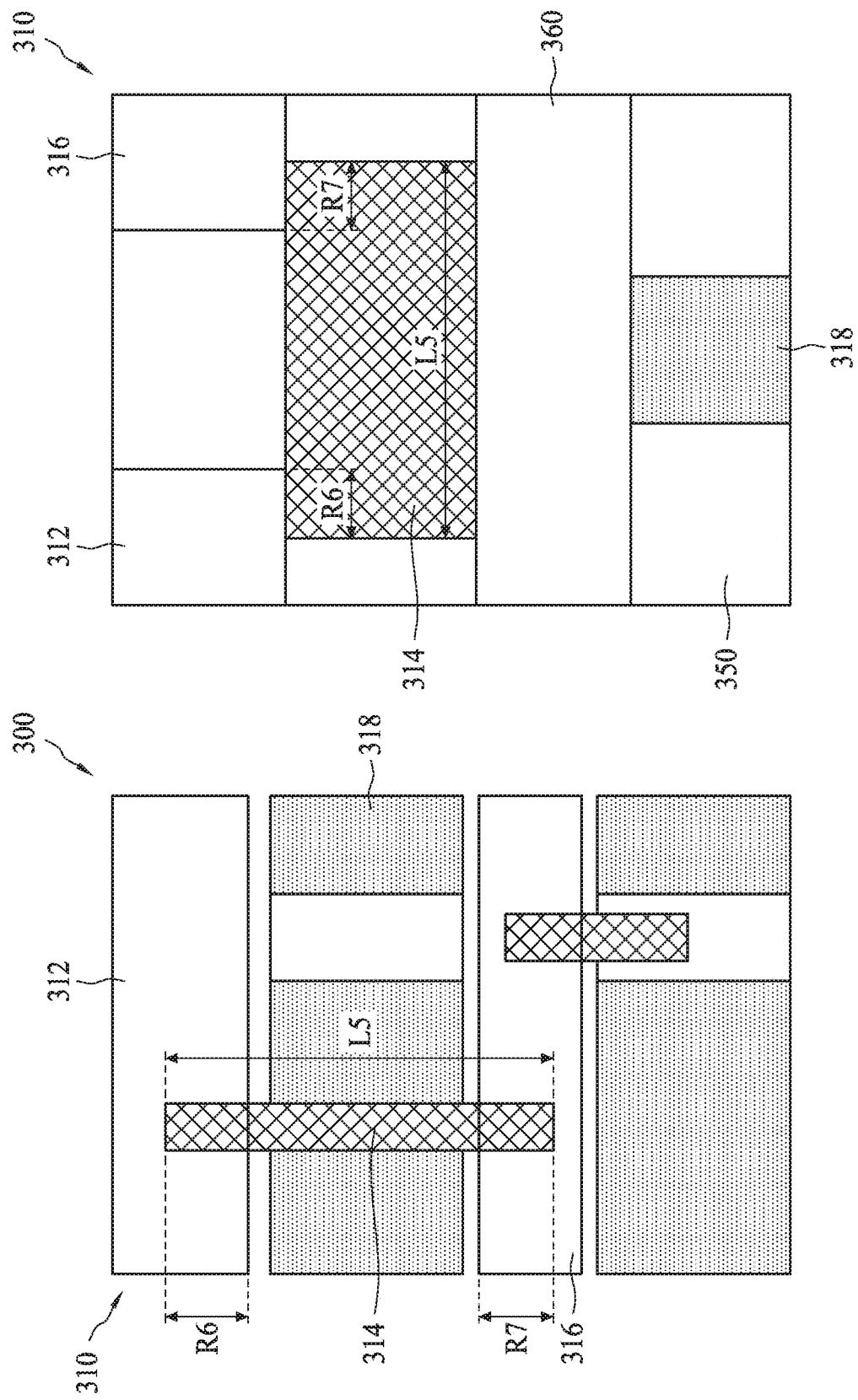

INTEGRATED CIRCUIT HAVING SLOT VIA AND METHOD OF FORMING THE SAME

PRIORITY DATA

The present application is a continuation application of U.S. patent application Ser. No. 14/600,695, filed Jan. 20, 2015, issuing as U.S. Pat. No. 9,478,492, entitled "INTEGRATED CIRCUIT HAVING SLOT VIA AND METHOD OF FORMING THE SAME", which is hereby incorporated by reference in its entirety.

BACKGROUND

An integrated circuit includes multiple semiconductor devices which are electrically connected together by an interconnect structure. The interconnect structure includes conductive lines which provide routing between the semiconductor devices in a direction parallel to a top surface of a substrate of the integrated circuit. The conductive lines are electrically connected together by conductive vias. The conductive vias are formed to have an entire top surface connected to a conductive line above the conductive vias, i.e., farther from the substrate, and to have an entire bottom surface connected to a conductive line below the conductive via, i.e., closer to the substrate.

Electrical current passing through the conductive lines and conductive vias of the interconnect structure introduce capacitance within the interconnect structure. In some instances, this capacitance is an unintended consequence of the conductive line and conductive via routing within the interconnect structure called parasitic capacitance. Parasitic capacitance impacts performance of the integrated circuit and is simulated prior to forming the integrated circuit using computer-modeling programs in order to determine performance characteristics of the integrated circuit.

Conductive vias are spaced apart from each other to reduce a risk of short-circuiting within the integrated circuit. A resistance of a conductive via is determined in part based on a size of the conductive via. A smaller conductive via has a higher resistance than a larger conductive via. As node sizes for integrated circuits decrease, sizes of conductive vias also decrease in order to maintain sufficient spacing between vias to reduce the risk of short-circuiting. As resistance within an integrated circuit increases, power consumption of the integrated circuit also increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B is a cross-sectional view of a connection area of an integrated circuit in accordance with some embodiments.

FIG. 1C is a cross-sectional view of a connection area of an integrated circuit in accordance with some embodiments.

FIG. 2B is a cross-sectional view of a connection area of an integrated circuit in accordance with some embodiments.

FIG. 2C is a cross-sectional view of a connection area of an integrated circuit in accordance with some embodiments.

FIG. 3A is a top view of an integrated circuit in accordance with some embodiments.

FIG. 3B is a cross-sectional view of a connection area of an integrated circuit in accordance with some embodiments.

DETAILED DESCRIPTION

Figure 1A:
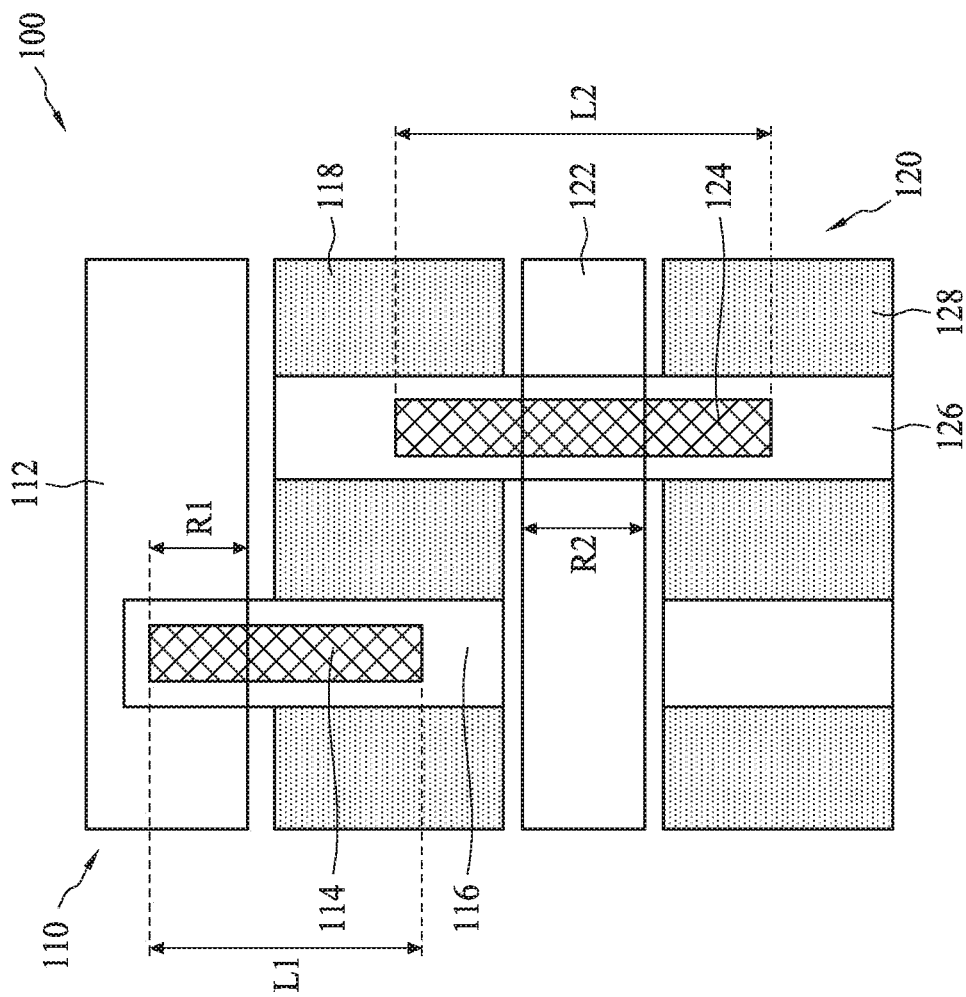
FIG. 1A is a top view of an integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a top view of an integrated circuit 100 in accordance with some embodiments. Integrated circuit 100 includes a connection area 110. Connection area 110 includes a first conductive line 112 configured to provide routing between devices within integrated circuit 100 in a direction parallel to a top surface of a substrate (150 in FIG. 1B) of the integrated circuit. A first slot via 114 is electrically connected to first conductive line 112. A top surface of slot via 114 is electrically connected to a bottom surface of first conductive line 112. First slot via 114 has a length L1 parallel to the top surface of the substrate (150 in FIG. 1B). First slot via 114 extends beyond a periphery of first conductive line 112 viewed in a top plan view. An overlap region R1 is a portion of first slot via 114 which interfaces with first conductive line 112. In at least some embodiments, R1 is a length portion of length L1. First slot via 114 is configured to provide electrical routing in a direction perpendicular to the top surface of the substrate (150 in FIG. 1B) of integrated circuit 100. Connection area 110 also includes a second conductive line 116 electrically connected to first slot via 114. Second conductive line 116 is configured to provide electrical routing in a direction parallel to the top surface of integrated circuit 100. A top surface of second conductive line 116 is electrically connected to a bottom surface of first slot via 114. Second conductive line 116 extends under first conductive line 112. An entirety of length L1 of first slot via 114 interfaces with second conductive line 116. Second conductive line 116 is electrically connected to a doped region 118. Doped region 118 is within the substrate (150 in FIG. 1B) of integrated circuit 100. First conductive line 112 is electrically connected to doped region 118 through first slot via 114 and second conductive line 116.

Integrated circuit 100 includes a second connection area 120. Second connection area 120 includes a third conductive line 122 configured to provide electrical routing in a direction parallel to the top surface of the substrate (150 in FIG. 1C) of integrated circuit 100. A second slot via 124 is electrically connected to third conductive line 122. A top surface of second slot via 124 is electrically connected to a bottom surface of third conductive line 122. Second slot via 124 has a length L2 parallel to the top surface of the substrate (150 in FIG. 1C). Second slot via 124 extends beyond a periphery of third conductive line 122. An overlap region R2 is a portion of second slot via 124 which interfaces with third conductive line 122. Second slot via 124 is configured to provide electrical routing in a direction perpendicular to the top surface of the substrate (150 in FIG. 1C) of integrated circuit 100. Connection area 120 also includes a fourth conductive line 126 electrically connected to second slot via 124. Second conductive line 126 is configured to provide electrical routing in a direction parallel to the top surface of integrated circuit 100. A top surface of fourth conductive line 126 is electrically connected to a bottom surface of second slot via 124. Fourth conductive line 126 extends under second conductive line 122. An entirety of length L2 of second slot via 124 interfaces with fourth conductive line 126. Fourth conductive line 126 is electrically connected to doped region 118 and to a doped region 128. Doped region 128 is within the substrate (150 in FIG. 1C) of integrated circuit 100. Doped region 128 is separate from doped region 118. Third conductive line 122 is electrically connected to doped region 118 and doped region 128 through second slot via 124 and second conductive line 126.

As nodes size in integrated circuits decreases, an effect of electrical resistance of vias in integrated circuits increases. The electrical resistance of a via is determined based on a size of a via, so the decreasing a node size results in a smaller via, thereby increasing resistance of the via. First slot via 114 helps to decrease an electrical resistance to a current flowing from first conductive line 112 to second conductive line 116 in comparison with another via which interfaces with the first conductive line along an entire length of the via. In some embodiments, the electrical resistance of first slot via 114 is reduced in comparison with vias which interface with both conductive lines along an entire length of the via. Second slot via 124 helps to decrease an electrical resistance to a current flowing from third conductive line 122 to fourth conductive line 126 in comparison with another via which interfaces with the third conductive line along an entire length of the via. In some embodiments, the electrical resistance of second slot via 124 is reduced in comparison with vias which interface with both conductive lines along an entire length of the via. The decreased resistance provided by first slot via 114 and second slot via 124 helps to increase a speed of integrated circuit 100. In addition, the decreased resistance also reduces power consumption in integrated circuit 100.

First conductive line 112 is part of an interconnect structure which electrically connects different portions of integrated circuit 100. In some embodiments, first conductive line 112 includes a metallic material such as copper, aluminum, tungsten, alloys thereof or other suitable metallic materials. In some embodiments, first conductive line 112 includes a conductive material other than a metallic material such as a conductive polymer, or another suitable conductive material. First conductive line 112 extends in a direction perpendicular to second conductive line 116. In some embodiments, first conductive line 112 includes a first portion extending in a first direction and a second portion extending in a second direction different from the first direction.

First conductive line 112 is formed by forming an opening in a dielectric material and filling the opening with a conductive material. In some embodiments, the opening is formed using an etching process. In some embodiments, the etching process includes a lithography process. In some embodiments, the opening is filled using chemical vapor deposition (CVD), physical vapor deposition (PVD), sputtering, atomic layer deposition (ALD) or another suitable process. In some embodiments, first conductive line 112 is formed using a damascene process, such as a dual damascene process.

First conductive line 112 of integrated circuit 100 is at a first metal level, M1. The first metal level is a first routing layer in a direction parallel to the top surface of the substrate (150 in FIG. 1B) above a contact level. In some embodiments, first conductive line 112 is at a different metal level of integrated circuit 100 from the first metal level. In some embodiments, first conductive line 112 is connected to a supply voltage such as VDD, VSS.

First slot via 114 electrically connects first conductive line 112 to second conductive line 116. First slot via 114 is a conductive material. In some embodiments, first slot via 114 includes a metallic material, such as copper, aluminum, tungsten, alloys thereof or another suitable metallic material. In some embodiments, first slot via 114 includes a conductive material other than a metallic material such as a conductive polymer, or another suitable conductive material.

First slot via 114 extends beyond a periphery of first conductive line 112 in a direction parallel to the top surface of the substrate (150 in FIG. 1B) of integrated circuit 100. Overlap region R1 is a portion of first slot via 114 which interfaces with first conductive line 112. A length of overlap region R1 is less than length L1 of first slot via 114. In some embodiments, a ratio of the length of overlap region R1 to length L1 ranges from about 0.2 to about 0.8. In some embodiments, a ratio of the length of overlap region R1 to length L1 ranges from about 0.1 to about 0.2. In some embodiments, a ratio of the length of overlap region R1 to length L1 ranges from about 0.8 to about 0.9

First slot via 114 is formed by forming an opening in a dielectric material and filling the opening with a conductive material. In some embodiments, the opening is formed using an etching process. In some embodiments, the etching process includes a lithography process. In some embodiments, the opening for first slot via 114 is formed using a same process as the opening for first conductive line 112. In some embodiments, the opening for first slot via 114 is formed using a different process from that used to form the first conductive line 112. In some embodiments, the opening for first slot via 114 is formed simultaneously with the opening for first conductive line 112. In some embodiments, the opening for first slot via 114 is formed sequentially with the opening for first conductive line 112. In some embodiments, the opening is filled using CVD, PVD, sputtering, ALD or another suitable process. In some embodiments, the opening for first slot via 114 is filled using a same process as the opening for first conductive line 112. In some embodiments, the opening for first slot via 114 is filled using a different process from that used to form the first conductive line 112. In some embodiments, the opening for first slot via 114 is filled simultaneously with the opening for first conductive line 112. In some embodiments, the opening for first slot via 114 is filled sequentially with the opening for first conductive line 112. In some embodiments, first slot via 114 is formed using a damascene process, such as a dual damascene process.

In some embodiments, there is one contact level in the integrated circuit 100. In some embodiments, there are at least two contact levels in the integrated circuit 100. In some embodiments, first slot via 114 is in a first contact level of integrated circuit 100. In some embodiments, second conductive line 116 is in a second contact level of integrated circuit 100. First slot via 114 is at a contact level of integrated circuit 100. In some embodiments, the contact level of an integrated circuit is called the metal zero, M0, level. The contact level is closer to the substrate (150 in FIG. 1B) of integrated circuit 100 than the first metal level. In some embodiments, first slot via 114 is at a different metal level of integrated circuit 100 from the contact level.

In some embodiments, first slot via 114 is in direct contact with first conductive line 112. In some embodiments, first slot via 114 is in direct contact with second conductive line 116.

Second conductive line 116 is part of an interconnect structure which electrically connects doped region 118 to other parts of integrated circuit 100. In some embodiments, second conductive line 116 includes a metallic material such as copper, aluminum, tungsten, alloys thereof or other suitable metallic materials. In some embodiments, second conductive line 116 includes a conductive material other than a metallic material such as a conductive polymer, or another suitable conductive material. Second conductive line 116 extends in a direction perpendicular to first conductive line 112. In some embodiments, second conductive line 116 includes a first portion extending in a first direction and a second portion extending in a second direction different from the first direction.

Second conductive line 116 is formed by forming an opening in a dielectric material and filling the opening with a conductive material. In some embodiments, the opening is formed using an etching process. In some embodiments, the etching process includes a lithography process. In some embodiments, the opening for second conductive line 116 is formed using a same process as the opening for first slot via 114. In some embodiments, the opening for first slot via 114 is formed using a different process from the process used to form the second conductive line 116. In some embodiments, the opening for first slot via 114 is formed simultaneously with the opening for second conductive line 116. In some embodiments, the opening for first slot via 114 is formed sequentially with the opening for second conductive line 116. In some embodiments, the opening for second conductive line 116 is filled using CVD, PVD, sputtering, ALD or another suitable process. In some embodiments, the opening for first slot via 114 is filled using a same process as the opening for second conductive line 116. In some embodiments, the opening for first slot via 114 is filled using a different process from that used to form the second conductive line 116. In some embodiments, the opening for first slot via 114 is filled simultaneously with the opening for second conductive line 116. In some embodiments, the opening for first slot via 114 is filled sequentially with the opening for second conductive line 116. In some embodiments, second conductive line 116 is formed using a damascene process, such as a dual damascene process.

Second conductive line 116 of integrated circuit 100 is at the contact level, M0. In some embodiments, second conductive line 116 is at a different metal level of integrated circuit 100 from the contact level.

Doped region 118 is a doped portion of the substrate (150 in FIG. 1B) of the integrated circuit. In some embodiments, doped region 118 is a source or drain of a transistor of integrated circuit 100. In some embodiments, doped region 118 is a well formed in the substrate (150 in FIG. 1B). In some embodiments, doped region 118 includes a p-type dopant. In some embodiments, doped region 118 includes an n-type dopant.

Third conductive line 122 is part of an interconnect structure which electrically connects different portions of integrated circuit 100. In some embodiments, third conductive line 122 includes a metallic material such as copper, aluminum, tungsten, alloys thereof or other suitable metallic materials. In some embodiments, third conductive line 122 includes a conductive material other than a metallic material such as a conductive polymer, or another suitable conductive material. Third conductive line 122 extends in a direction perpendicular to fourth conductive line 126. In some embodiments, third conductive line 122 includes a first portion extending in a first direction and a second portion extending in a second direction different from the first direction.

Third conductive line 122 is formed by forming an opening in a dielectric material and filling the opening with a conductive material. In some embodiments, the opening is formed using an etching process. In some embodiments, the etching process includes a lithography process. In some embodiments, the opening is filled using CVD, PVD, sputtering, ALD or another suitable process. In some embodiments, third conductive line 122 is formed using a damascene process, such as a dual damascene process.

Third conductive line 122 of integrated circuit 100 is at the first metal level, M1. In some embodiments, third conductive line 122 is at a different metal level of integrated circuit 100 from the first metal level. In some embodiments, third conductive line 122 is connected to a reference voltage such as VDD, VSS.

Second slot via 124 electrically connects third conductive line 122 to fourth conductive line 126. Second slot via 124 is a conductive material. In some embodiments, second slot via 124 includes a metallic material, such as copper, aluminum, tungsten, alloys thereof or another suitable metallic material. In some embodiments, second slot via 124 includes a conductive material other than a metallic material such as a conductive polymer, or another suitable conductive material.

Second slot via 124 extends beyond a periphery of third conductive line 122 in a direction parallel to the top surface of the substrate (150 in FIG. 1C) of integrated circuit 100. Overlap region R2 is a portion of second slot via 124 which interfaces with third conductive line 122. A length of overlap region R2 is less than length L2 of second slot via 124. In some embodiments, a ratio of the length of overlap region R2 to length L2 ranges from about 0.2 to about 0.8. In some embodiments, a ratio of the length of overlap region R2 to length L2 ranges from about 0.1 to about 0.2. In some embodiments, a ratio of the length of overlap region R2 to length L2 ranges from about 0.8 to about 0.9. In some embodiments, the ratio between the length of overlap region R2 to length L2 is equal to the ratio between the length of overlap region R1 and length L1. In some embodiments, the ratio between the length of overlap region R2 to length L2 is different from the ratio between the length of overlap region R1 and length L1.

Second slot via 124 is formed by forming an opening in a dielectric material and filling the opening with a conductive material. In some embodiments, the opening is formed using an etching process. In some embodiments, the etching process includes a lithography process. In some embodiments, the opening for second slot via 124 is formed using a same process as the opening for third conductive line 122. In some embodiments, the opening for second slot via 124 is formed using a different process from that used to form the third conductive line 122. In some embodiments, the opening for second slot via 124 is formed simultaneously with the opening for third conductive line 122. In some embodiments, the opening for second slot via 124 is formed sequentially with the opening for third conductive line 122. In some embodiments, the opening is filled using CVD, PVD, sputtering, ALD or another suitable process. In some embodiments, the opening for second slot via 124 is filled using a same process as the opening for third conductive line 122. In some embodiments, the opening for second slot via 124 is filled using a different process from that used to form the third conductive line 122. In some embodiments, the opening for second slot via 124 is filled simultaneously with the opening for third conductive line 122. In some embodiments, the opening for second slot via 124 is filled sequentially with the opening for third conductive line 122. In some embodiments, second slot via 124 is formed using a damascene process, such as a dual damascene process.

In some embodiments, there is one contact level in the integrated circuit 100. In some embodiments, there are at least two contact levels in the integrated circuit 100. In some embodiments, second slot via 124 is in a first contact level of integrated circuit 100. In some embodiments, fourth conductive line 126 is in a second contact level of integrated circuit 100. Second slot via 124 is at the contact level of integrated circuit 100. In some embodiments, second slot via 124 is at a different metal level of integrated circuit 100 from the contact level.

In some embodiments, second slot via 124 is in direct contact with third conductive line 122. In some embodiments, second slot via 124 is in direct contact with fourth conductive line 126.

Fourth conductive line 126 is part of an interconnect structure which electrically connects doped region 118 and doped region 128 to other parts of integrated circuit 100. In some embodiments, fourth conductive line 126 includes a metallic material such as copper, aluminum, tungsten, alloys thereof or other suitable metallic materials. In some embodiments, fourth conductive line 126 includes a conductive material other than a metallic material such as a conductive polymer, or another suitable conductive material. Fourth conductive line 126 extends in a direction perpendicular to third conductive line 122. In some embodiments, fourth conductive line 126 includes a first portion extending in a first direction and a second portion extending in a second direction different from the first direction.

Fourth conductive line 126 is formed by forming an opening in a dielectric material and filling the opening with a conductive material. In some embodiments, the opening is formed using an etching process. In some embodiments, the etching process includes a lithography process. In some embodiments, the opening for fourth conductive line 126 is formed using a same process as the opening for second slot via 124. In some embodiments, the opening for second slot via 124 is formed using a different process from that used to form the fourth conductive line 126. In some embodiments, the opening for second slot via 124 is formed simultaneously with the opening for fourth conductive line 126. In some embodiments, the opening for second slot via 124 is formed sequentially with the opening for fourth conductive line 126. In some embodiments, the opening for fourth conductive line 126 is filled using CVD, PVD, sputtering, ALD or another suitable process. In some embodiments, the opening for second slot via 124 is filled using a same process as the opening for fourth conductive line 126. In some embodiments, the opening for second slot via 124 is filled using a different process from that used to form the fourth conductive line 126. In some embodiments, the opening for second slot via 124 is filled simultaneously with the opening for fourth conductive line 126. In some embodiments, the opening for second slot via 124 is filled sequentially with the opening for fourth conductive line 126. In some embodiments, fourth conductive line 126 is formed using a damascene process, such as a dual damascene process.

Fourth conductive line 126 of integrated circuit 100 is at the contact level, M0. In some embodiments, fourth conductive line 126 is at a different metal level of integrated circuit 100 from the contact level.

Doped region 128 is a doped portion of the substrate (150 in FIG. 1C) of the integrated circuit. In some embodiments, doped region 128 is a source or drain of a transistor of integrated circuit 100. In some embodiments, doped region 128 is a well formed in the substrate (150 in FIG. 1C). In some embodiments, doped region 128 includes a p-type dopant. In some embodiments, doped region 128 includes an n-type dopant. In some embodiments, doped region 128 includes a same dopant type as doped region 118. In some embodiments, doped region 128 includes a different dopant type from doped region 118.

FIG. 1B is a cross-sectional view of connection area 110 of integrated circuit 100 in accordance with some embodiments. Connection area 110 includes substrate 150 of integrated circuit 100. Doped region 118 is in substrate 150. Second conductive line 116 is electrically connected to doped region 118. First slot via 114 is electrically connected to second conductive line 116; and first conductive line 112 is electrically connected to the first slot via on a side of the first slot via opposite the second conductive line.

First slot via 114 extends beyond the periphery of first conductive line 112 and overlaps with the first conductive line at overlap region R1. The entire length L1 of first slot via 114 interfaces with second conductive line 116. In some embodiments, second conductive line 116 extends beyond a side of overlap region R1 farthest from doped region 118, as seen in FIG. 1A. In some embodiments, an end face of second conductive line 116 is substantially aligned with an end face of overlap region R1, as seen in FIG. 1B.

In comparison with other approaches which include a via which does not extend beyond the periphery of first conductive line 112, slot via 114 provides an increased surface area interfacing with second conductive line 116. This increased surface area provides a greater area for electrical transfer between first slot via 114 and second conductive line 116, which reduces electrical resistance of the first slot via in comparison with a via which does not extend beyond the periphery of first conductive line 112.

FIG. 1C is a cross-sectional view of connection area 120 of integrated circuit 100 in accordance with some embodiments. Connection area 120 includes substrate 150 of integrated circuit 100. Doped region 118 and doped region 128 are in substrate 150. Fourth conductive line 126 is electrically connected to doped region 118 and doped region 128. Second slot via 124 is electrically connected to fourth conductive line 126; and third conductive line 122 is electrically connected to the second slot via on a side of the second slot via opposite the fourth conductive line.

Second slot via 124 extends beyond the periphery of third conductive line 122 and overlaps with the third conductive line at overlap region R2. The entire length L2 of second slot via 124 interfaces with fourth conductive line 126. Fourth conductive line 116 extends beyond overlap region R2.

In comparison with other approaches which include a via which does not extend beyond the periphery of third conductive line 122, second slot via 124 provides an increased surface area interfacing with fourth conductive line 126. This increased surface area provides a greater area for electrical transfer between second slot via 124 and fourth conductive line 126, which reduces electrical resistance of the second slot via in comparison with a via which does not extend beyond the periphery of third conductive line 122.

Figure 2A:
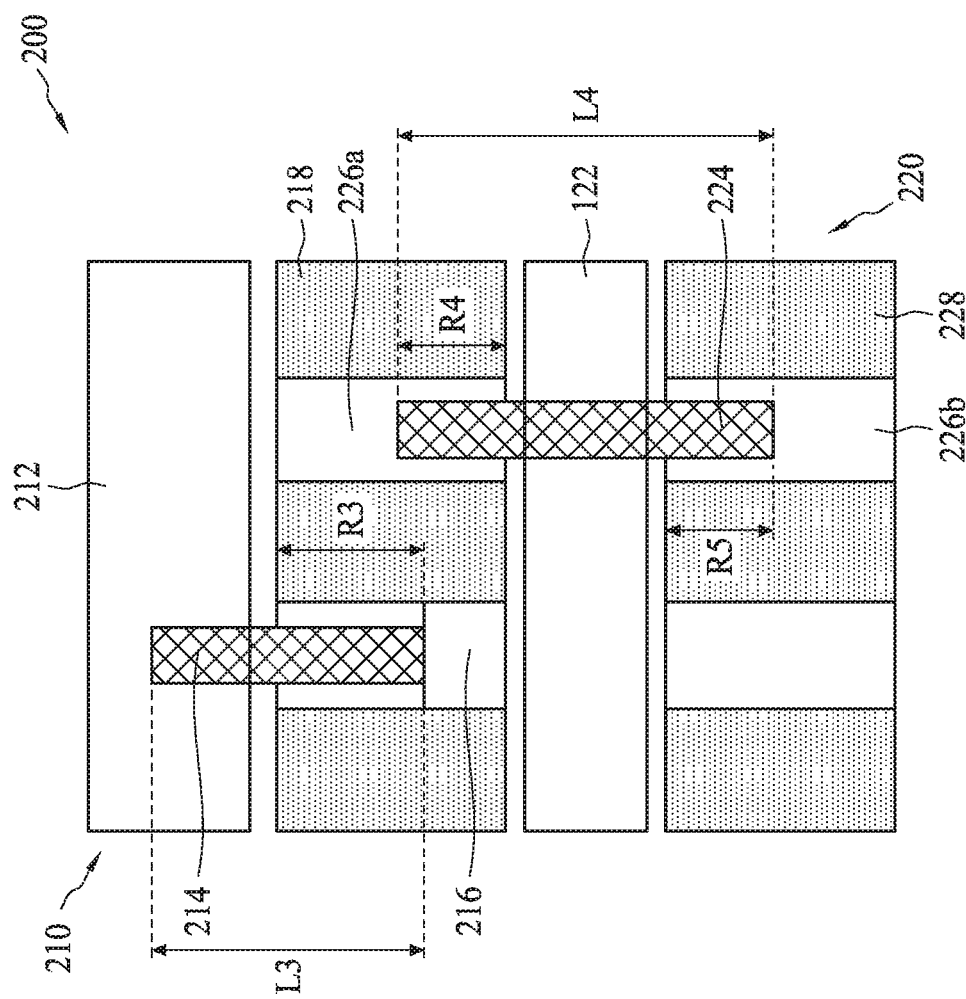
FIG. 2A is a top view of an integrated circuit in accordance with some embodiments.

FIG. 2A is a top view of an integrated circuit 200 in accordance with some embodiments. Integrated circuit 200 is similar to integrated circuit 100 (FIG. 1A). Similar elements have a same reference number increased by 100. In comparison with integrated circuit 100, fourth conductive line 126 in FIG. 1A is split into two separate conductive lines 226a and 226b. Conductive line 226a electrically connects second slot via 224 to doped region 218. Conductive line 226b electrically connects second slot via 224 to doped region 228. In comparison with integrated circuit 100, integrated circuit 200 includes first slot via 214 which extends beyond a periphery of second conductive line 216. Second slot via 224 also extends beyond a periphery of conductive line 226a and conductive line 226b. In comparison with integrated circuit 100, second conductive line 216 does not overlap with first conductive line 212. Conductive line 226a and conductive line 226b do not overlap with third conductive line 222.

First slot via 214 includes an overlap region R3 which interfaces with second conductive line 216. Overlap region R3 is located beyond a periphery of first conductive line 212. A length of overlap region R3 is less than a length L3 of first slot via 214. In some embodiments, a ratio of the length of overlap region R3 to length L3 ranges from about 0.2 to about 0.8. In some embodiments, a ratio of the length of overlap region R3 to length L3 ranges from about 0.1 to about 0.2. In some embodiments, a ratio of the length of overlap region R3 to length L3 ranges from about 0.8 to about 0.9. In some embodiments, overlap region R3 is aligned with a sidewall of first conductive line 212. In some embodiments, a portion of first slot via 214 interfaces with neither first conductive line 212 nor second conductive line 216.

Second slot via 224 includes an overlap region R4 which interfaces with conductive line 226a. Second slot via 224 also includes an overlap region R5 which interfaces with conductive line 226b. Overlap region R4 is located beyond a periphery of third conductive line 222. A length of overlap region R4 is less than a length L4 of second slot via 224. In some embodiments, a ratio of the length of overlap region R4 to length L4 ranges from about 0.1 to about 0.4. In some embodiments, a ratio of the length of overlap region R4 to length L4 ranges from about 0.4 to about 0.9. In some embodiments, overlap region R4 is aligned with a sidewall of third conductive line 222. In some embodiments, a portion of second slot via 224 extending toward doped region 218 interfaces with neither third conductive line 222 nor conductive line 226a. Overlap region R5 is located beyond a periphery of third conductive line 222. A length of overlap region R5 is less than a length L4 of second slot via 224. In some embodiments, a ratio of the length of overlap region R5 to length L4 ranges from about 0.1 to about 0.4. In some embodiments, a ratio of the length of overlap region R5 to length L4 ranges from about 0.4 to about 0.9. In some embodiments, the ratio of the length of overlap region R4 to length L4 is equal to the ratio of the length of overlap region R5 to length L4. In some embodiments, the ratio of the length of overlap region R4 to length L4 is different from the ratio of the length of overlap region R5 to length L4. In some embodiments, overlap region R5 is aligned with a sidewall of third conductive line 222. In some embodiments, a portion of second slot via 224 extending toward doped region 228 interfaces with neither third conductive line 222 nor conductive line 226b.

In comparison with integrated circuit 100, integrated circuit 200 reduces a capacitance between first conductive line 212 and second conductive line 216. By not extending second conductive line 216 underneath first conductive line 212, an unintentional capacitance between the first conductive line and the second conductive line is reduced. In some embodiments, the unintentional capacitance is called parasitic capacitance. By reducing the parasitic capacitance, integrated circuit 200 reduces a resistance to a change in voltage along first conductive line 212 or second conductive line 216, which in turn helps to increase a speed of the integrated circuit.

Integrated circuit 200 also reduces a capacitance between third conductive line 222 and conductive line 226a as well as between the third conductive line and conductive line 226b. By not extending conductive line 226a or conductive line 226b underneath third conductive line 222, parasitic capacitance within integrated circuit 200 is reduced in comparison with integrated circuit 100. By reducing the parasitic capacitance, integrated circuit 200 reduces a resistance to a change in voltage along third conductive line 222, conductive line 226a or conductive line 226b, which in turn helps to increase the speed of the integrated circuit. In some embodiments, a speed of integrated circuit 200 is greater than a speed of an integrated circuit having a via which does not extend beyond a periphery of first conductive line 212.

FIG. 2B is a cross-sectional view of connection area 210 of integrated circuit 200 in accordance with some embodiments. Connection area 210 is similar to connection area 110. In comparison with connection area 110, connection area 210 includes no portion of second conductive line 216 in a contact layer 260 underneath first conductive line 212.

First slot via 214 extends beyond the periphery of first conductive line 212 and overlaps with second conductive line 216 at overlap region R3. Less than the entire length L3 of first slot via 214 interfaces with second conductive line 216. In some embodiments, a sidewall of second conductive line 216 is aligned with a sidewall of first conductive line 212. In some embodiments, a portion of first slot via 214 is free of an electrical interface with first conductive line 212 and second conductive line 216.

In some embodiments, the sidewall of second conductive line 216 is aligned with an edge of doped region 218 in substrate 250. In some embodiments, the sidewall of second conductive line 216 is aligned with a sidewall of first conductive line 212. In some embodiments, the sidewall of second conductive line 216 is not aligned with either the sidewall of first conductive line 212 or the edge of doped region 218.

FIG. 2C is a cross-sectional view of connection area 220 of integrated circuit 200 in accordance with some embodiments. In comparison with connection area 120, connection area 220 includes conductive line 226a in contact layer 260 electrically connected to doped region 218 and conductive line 226b electrically connected to doped region 228 in substrate 250. In some embodiments, neither of conductive line 226a nor conductive line 226b extends underneath third conductive line 222. In some embodiments, at least one of conductive line 226a or conductive line 226b extends underneath third conductive line 222

Second slot via 224 extends beyond the periphery of third conductive line 222 and overlaps with conductive line 226a at overlap region R4. Second slot via 224 extends beyond the periphery of third conductive line 222 and overlaps with conductive line 226b at overlap region R5. Less than the entire length L4 of second slot via 224 interfaces with conductive line 226a; and less than the entire length L4 of the second slot via interfaces with conductive line 226b. In some embodiments, a portion of second slot via 224 is free of an electrical interface with third conductive line 222, conductive line 226a and conductive line 226b.

In some embodiments, the sidewall of conductive line 226a is aligned with an edge of doped region 218. In some embodiments, the sidewall of conductive line 226a is aligned with a sidewall of third conductive line 222. In some embodiments, the sidewall of conductive line 226a is not aligned with either the sidewall of third conductive line 222 or the edge of doped region 218.

In some embodiments, the sidewall of conductive line 226b is aligned with an edge of doped region 228. In some embodiments, the sidewall of conductive line 226b is aligned with a sidewall of third conductive line 222. In some embodiments, the sidewall of conductive line 226b is not aligned with either the sidewall of third conductive line 222 or the edge of doped region 228.

FIG. 3A is a top view of an integrated circuit 300 in accordance with some embodiments. Integrated circuit 300 is similar to integrated circuit 100 (FIG. 1A). Similar elements have a same reference number increased by 200. In comparison with integrated circuit 100, integrated circuit 300 includes second conductive line 316 on a same metal level as first conductive line 312. Second conductive line 316 is physically spaced from first conductive line 312. Second conductive line 316 is electrically connected to first conductive line 312 by first slot via 314. Neither first conductive line 312 nor second conductive line 316 is electrically connected to doped region 318.

First slot via 314 extends beyond a periphery of both first conductive line 312 and second conductive line 316. First slot via 314 interfaces with first conductive line 312 at an overlap region R6. A length of overlap region R6 is less than length L5 of first slot via 314. In some embodiments, a ratio of the length of overlap region R6 to length L5 ranges from about 0.1 to about 0.4. In some embodiments, a ratio of the length of overlap region R6 to length L5 ranges from about 0.4 to about 0.9. First slot via 314 interfaces with second conductive line 316 at an overlap region R7. A length of overlap region R7 is less than length L5 of first slot via 314. In some embodiments, a ratio of the length of overlap region R7 to length L5 ranges from about 0.1 to about 0.4. In some embodiments, a ratio of the length of overlap region R7 to length L5 ranges from about 0.4 to about 0.9. In some embodiments, the ratio of the length of overlap region R6 to length L5 is equal to the ratio of the length of overlap region R7 to length L5. In some embodiments, the ratio of the length of overlap region R6 to length L5 is different from the ratio of the length of overlap region R7 to length L5.

In comparison with integrated circuit which has a via which does not extend beyond a periphery of a conductive line, integrated circuit 300 includes fewer elements in an interconnect structure. In an integrated circuit which has a via which does not extend beyond the periphery of first conductive line 312 or second conductive line 316, an additional conductive line is used to provide electrical connection between vias connected to the first conductive line and the second conductive line. By reducing a number of conductive lines in the interconnect structure of integrated circuit 300, a complexity and cost of the integrated circuit is reduced.

FIG. 3B is a cross-sectional view of connection area 310 of integrated circuit 300 in accordance with some embodiments. Connection area 310 includes first slot via 314 electrically connecting first conductive line 312 to second conductive line 316 which is on a same metal level as the first conductive line. Connection area 310 includes first slot via 314 located below first conductive line 312 and second conductive line 316. In some embodiments, first slot via 314 is located above first conductive line 312 and second conductive line 314. First slot via 314 interfaces with first conductive line 312 at overlap region R6, which is smaller than a width of the first conductive line 312. In some embodiments, a sidewall of first slot via 314 is aligned with a sidewall of first conductive line 312 farthest from second conductive line 316, so that a length of overlap region R6 is equal to the width of first conductive line 312. First slot via 314 interfaces with second conductive line 316 at overlap region R7, which is smaller than a width of the second conductive line 316. In some embodiments, a sidewall of first slot via 314 is aligned with a sidewall of second conductive line 316 farthest from first conductive line 312, so that a length of overlap region R7 is equal to the width of second conductive line 316. In some embodiments, first slot via 314 is separated from doped region 318 by contact layer 360. In some embodiments, first slot via 314 is connected to doped region 318 in substrate 350 by a conductive feature in contact layer 360. In some embodiments, contact layer 360 is omitted and first slot via 314 is in direct contact with doped region 318.

Figure 4:
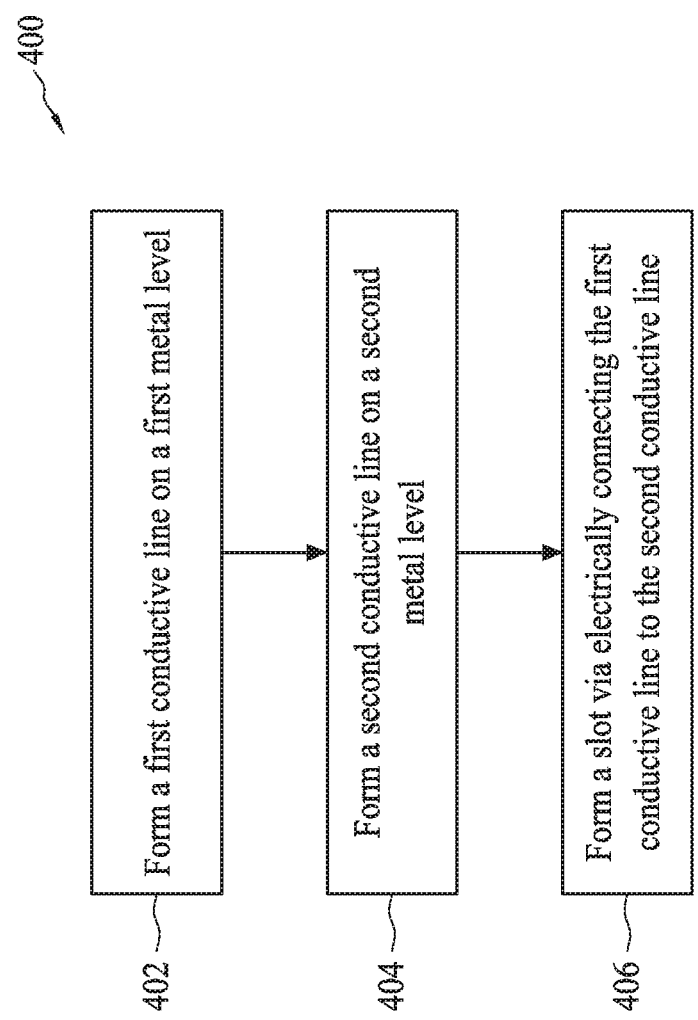
FIG. 4 is a flowchart of a method of making an integrated circuit in accordance with some embodiments.

FIG. 4 is a flowchart of a method 400 of making an integrated circuit in accordance with some embodiments. Method 400 begins with operation 402, in which a first conductive line is formed on a first metal level. In some embodiments, the first conductive line is formed by forming an opening in a dielectric layer and filling the opening with a conductive material. In some embodiments, the opening in the dielectric layer is formed by an etching process. In some embodiments, the opening is filled using CVD, PVD, sputtering, ALD or another suitable filling process. In some embodiments, the opening is filled with a metallic material, such as copper, aluminum, tungsten, alloys thereof or another suitable metallic material. In some embodiments, the opening is filled with a non-metallic material, such as a conductive polymer. In some embodiments, the first metal level is a contact level, M0. In some embodiments, the first metal level is a first metal level, M1. In some embodiments, the first metal level is different from the first metal level, M1 and the contact level, M0.

In operation 404, in which a second conductive line is formed on a second metal level. In some embodiments, the second conductive line is formed by forming an opening in a dielectric layer and filling the opening with a conductive material. In some embodiments, the opening in the dielectric layer is formed by an etching process. In some embodiments, the opening is filled using CVD, PVD, sputtering, ALD or another suitable filling process. In some embodiments, the opening for the second conductive line is filled using a same process as the opening for the first conductive line. In some embodiments, the opening for the second conductive line is filled using a different process from the process for filling the opening of the first conductive line. In some embodiments, the opening is filled with a metallic material, such as copper, aluminum, tungsten, alloys thereof or another suitable metallic material. In some embodiments, the opening is filled with a non-metallic material, such as a conductive polymer. In some embodiments, the second metal level is a contact level, M0. In some embodiments, the second metal level is a first metal level, M1. In some embodiments, the second metal level is different from the first metal level, M1 and the contact level, M0. In some embodiments, the second metal level for the second conductive line is the same metal level as the first metal level for the first conductive line. In some embodiments, the second metal level for the second conductive line is different from the metal level of the first metal level for the first conductive line. In some embodiments, the second conductive line is formed simultaneously with the first conductive line. In some embodiments, the second conductive line is formed sequentially with the first conductive line.

In some embodiments, at least a portion of the second conductive line extends underneath the first conductive line. In some embodiments, a sidewall of the second conductive line is aligned with a sidewall of the first conductive line. In some embodiments, a sidewall of the second conductive line is spaced from a sidewall of the first conductive line in a direction parallel to a top surface of a substrate of the integrated circuit.

In operation 406, a slot via is formed to electrically connect the first conductive line to the second conductive line. In some embodiments, the slot via is formed by forming an opening in a dielectric layer and filling the opening with a conductive material. In some embodiments, the opening in the dielectric layer is formed by an etching process. In some embodiments, the opening is filled using CVD, PVD, sputtering, ALD or another suitable filling process. In some embodiments, the opening for the slot via is filled using a same process as the opening for at least one of the first conductive line or the second conductive line. In some embodiments, the opening for the slot via is filled using a different process from the process for filling the opening of at least one of the first conductive line or the second conductive line. In some embodiments, the opening is filled with a metallic material, such as copper, aluminum, tungsten, alloys thereof or another suitable metallic material. In some embodiments, the opening is filled with a non-metallic material, such as a conductive polymer. In some embodiments, the slot via is on the contact level, M0. In some embodiments, the slot via is on the first metal level, M1. In some embodiments, slot via is on a same metal level as the first metal level or the second metal level. In some embodiments, the slot via is on a different metal level from at least one of the first metal level or the second metal level. In some embodiments, the slot via is formed simultaneously with at least one of the first conductive line or the second conductive line. In some embodiments, the slot via is formed sequentially with at least one of the first conductive line or the second conductive line.

At least a portion of the slot via overlaps with the first conductive line. At least a portion of the slot via overlaps with the second conductive line. At least a portion of the slot via extends beyond a periphery of at least one of the first conductive line or the second conductive line. In some embodiments, an entirety of the slot via overlaps with the first conductive line or the second conductive line. In some embodiments, a portion of the slot via is free of an interface with both the first conductive line and the second conductive line.

In some embodiments, an order of operations of method 400 is changed. In some embodiments, additional operations are included in method 400. In some embodiments, some of the operations of method 400 are combined into a single operation.

One aspect of this description relates to an integrated circuit. The integrated circuit includes a first conductive line on a first metal level of the integrated circuit. The integrated circuit further includes a second conductive line on a second metal level of the integrated circuit. The integrated circuit further includes a slot via electrically connecting the first conductive line with the second conductive line. The slot via overlaps with the first conductive line and with the second conductive line. The slot via extends beyond a periphery of at least one of the first conductive line or the second conductive line.

Another aspect of this description relates to an integrated circuit. The integrated circuit includes a first doped region in a substrate. The integrated circuit further includes a first conductive line, wherein a bottom surface of the first conductive line is spaced from the substrate by a first distance. The integrated circuit further includes a second conductive line, wherein a bottom surface of the second conductive line is spaced from the substrate by a second distance. The integrated circuit further includes a slot via electrically connecting the first conductive line to the second conductive line. A first portion of the slot via is in direct contact with the first conductive line. A second portion of the slot via is in direct contact with the second conductive line. The slot via extends beyond a periphery of at least one of the first conductive line or the second conductive line.

Still another aspect of this description relates to a method of making an integrated circuit. The method includes forming a first conductive line on a first metal level of the integrated circuit. The method further includes forming a second conductive line on a second metal level of the integrated circuit. The method further includes forming a slot via to electrically connect the first conductive line to the second conductive line. A first portion of the slot via overlaps with the first conductive line, a second portion of the slot via overlaps with the second conductive line. The slot via extends beyond a periphery of at least one of the first conductive line or the second conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit comprising:
a first doped region in a substrate;
a first conductive line over a top surface of the substrate, and wherein the first conductive line has a first length extending in a first direction and a first width extending in a second direction, the first length being greater than the first width and each of the first length and first width is parallel with the top surface of the substrate;
a second conductive line parallel and coplanar with the first conductive line, wherein the second conductive line has a second length and a second width, the second width being less than the second length and each of the second width and second length being parallel with the top surface of the substrate, wherein the first doped region is disposed below and interposing the first and second conductive lines; and
a slot via interfacing the first and second conductive lines wherein the slot via has a third length and a third width each parallel with the top surface of the substrate, and wherein the third length is greater than the third width, wherein a first portion of the slot via is in direct contact with the first conductive line, a second portion of the slot via is in direct contact with the second conductive line, and the slot via extends beyond a periphery of at least one of the first conductive line or the second conductive line such that a sum of a length of the first portion and a length of the second portion is less than the third length of the slot via.

2. The integrated circuit of claim 1, further comprising:
another slot via over the second conductive line, wherein the another slot via has a fourth length and a fourth width each parallel with the top surface of the substrate, and wherein the fourth length is greater than the fourth width, wherein a first portion of the another slot via is in direct contact with the second conductive line.

3. The integrated circuit of claim 2, wherein the another slot via electrically connects the second conductive line and a third conductive line, wherein the third conductive line has a fifth length and a fifth width each parallel with the top surface of the substrate, and wherein the fifth length is greater than the fifth width, and wherein the another slot via is in direct contact with the second conductive line.

4. The integrated circuit of claim 3, wherein a third portion of the another slot via is in direct contact with the second conductive line, a fourth portion of the slot via is in direct contact with the third conductive line, and the another slot via extends beyond a periphery of at least one of the second conductive line or the third conductive lines such that a sum of a length of the third portion and a length of the fourth portion is less than the fourth length of the another slot via.

5. The integrated circuit of claim 1, wherein the slot via is at least one of copper, aluminum, tungsten, or alloys thereof.

6. The integrated circuit of claim 1, wherein the slot via is a conductive polymer.

7. The integrated circuit of claim 1, wherein the first and second conductive lines are coplanar as the first and second conductive lines are disposed on a same metal layer of the integrated circuit.

8. The integrated circuit of claim 1, wherein a first ratio of the length of the first portion to the third length is equal to a second ratio of the length of the second portion to the third length.

9. The integrated circuit of claim 1, wherein a ratio of the length of the first portion to the third length of the slot via is between about 0.1 and 0.4.

10. An integrated circuit comprising:
a first doped region and a second doped region in a substrate;
a first conductive line over a top surface of the substrate, and wherein the first conductive line has a first segment with a first length extending in a first direction and a first width extending in a second direction, the first length being greater than the first width and each of the first length and first width is parallel with the top surface of the substrate and a second segment collinear with the first segment and having a second length extending in the first direction and a second width extending in the second direction, the second length being greater than the second width and each of the second length and second width is parallel with the top surface of the substrate;
a second conductive line over the first conductive line, wherein the second conductive line has a third length and a third width, the third width being less than the third length and each of the third width and third length being parallel with a top surface of the substrate, wherein the second conductive line interposes the first and second segments of the first conductive line;
a first slot via interfacing the first and second segments of the first conductive line and the second conductive line, wherein the first slot via has a fourth length and a fourth width each parallel with the top surface of the substrate, and wherein the fourth length is greater than the fourth width, wherein a first portion of the first slot via is in direct contact with the first segment of the first conductive line, a second portion of the first slot via is in direct contact with the second segment of the first conductive line, and a third portion of the first slot via is in direct contact with the second conductive line.

11. The integrated circuit of claim 10, wherein a sum of a length of the first portion, a length of the second portion, and a length of the third portion is less than the fourth length of the slot via.

12. The integrated circuit of claim 10, further comprising:
a third conductive line over the top surface of the substrate, and wherein the third conductive line has a fifth length extending in a first direction and a fifth width extending in a second direction, the fifth length being greater than the fifth width and each of the fifth length and fifth width is parallel with the top surface of the substrate;
a fourth conductive line over the top surface of the substrate, wherein the fourth conducive line has a sixth length and a sixth width, the sixth width being less than the sixth length and each of the sixth width and sixth length being parallel with the top surface of the substrate; and
a second slot via interfacing the third and fourth conductive lines, wherein a first portion of the second slot via is in direct contact with the third conductive line, a second portion of the second slot via is in direct contact with the fourth conductive line, and the second slot via extends beyond a periphery of at least one of the third conductive line or the fourth conductive line such that a sum of a length of the first portion and a length of the second portion is less than an entire length of the second slot via.

13. A method of fabricating an integrated circuit, the method comprising:
depositing a first conductive line over a top surface of the substrate, and wherein the first conductive line has a first length extending in a first direction and a first width extending in a second direction, the first length being greater than the first width and each of the first length and first width is parallel with the top surface of the substrate;
forming a dielectric layer over the first conductive line;

forming at least one opening in the dielectric layer, wherein the at least one opening defines a second conductive line and a slot via;

filling the at least one opening with a conductive material to form the second conductive line above the first conductive line, wherein the second conductive line has a second length and a second width, the second width being less than the second length and each of the second width and second length being parallel with the top surface of the substrate; and filling the at least one opening to form the slot via interfacing the first and second conductive lines and electrically connecting the first conductive line to the second conductive line, wherein the slot via has a third length and a third width each parallel with the top surface of the substrate, and wherein the third length is greater than the third width, wherein a first portion of the slot via is in direct contact with the first conductive line, a second portion of the slot via is in direct contact with the second conductive line, and the slot via extends beyond a periphery of at least one of the first conductive line or the second conductive line such that a sum of a length of the first portion and a length of the second portion is less than the third length of the slot via.

14. The method of claim 13, further comprising:
doping a region on the substrate, wherein the first conductive line is coupled to the doped region.

15. The method of claim 13, wherein the filling the at least one opening includes depositing copper, aluminum, tungsten, or alloys thereof.

16. The method of claim 13, wherein the filling the at least one opening includes depositing a conductive polymer.

17. The method of claim 13, wherein the filling the at least one opening to form the second conductive line and the filling the at least one opening to form the slot via is performed using a same process.

18. The method of claim 17, wherein the same process includes at least one of chemical vapor deposition (CVD), physical vapor deposition (PVD), sputtering, and atomic layer deposition (ALD).

19. The method of claim 13, wherein the forming the at least one opening in the dielectric layer includes etching the dielectric layer.

20. The method of claim 13, wherein the filling the at least one opening to form the second conductive line and the filling the at least one opening to form the slot via are performed sequentially.

* * * * *